(12) United States Patent
Chung et al.

(10) Patent No.: US 7,872,511 B2
(45) Date of Patent: *Jan. 18, 2011

(54) CIRCUIT AND METHOD FOR INITIALIZING AN INTERNAL LOGIC UNIT IN A SEMICONDUCTOR MEMORY DEVICE

(75) Inventors: Jin-Il Chung, Kyoungki-do (KR);
Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/541,102

(22) Filed: Aug. 13, 2009

(65) Prior Publication Data

US 2009/0302913 A1 Dec. 10, 2009

Related U.S. Application Data

(63) Continuation of application No. 11/479,689, filed on Jun. 30, 2006, now Pat. No. 7,586,350.

(30) Foreign Application Priority Data

Sep. 28, 2005 (KR) ............ 2005-0090840
Dec. 29, 2005 (KR) ............ 2005-0134009

(51) Int. Cl.
*H03K 3/02* (2006.01)
(52) U.S. Cl. ..................... 327/198; 327/143
(58) Field of Classification Search ......... 327/141–143, 327/198; 714/724, 738
See application file for complete search history.

(56) References Cited

U.S. PATENT DOCUMENTS 5,686,844 A 11/1997 Hull et al.
5,754,879 A 5/1998 Johnston
5,905,690 A 5/1999 Sakurai et al.
6,408,415 B1 6/2002 Kim
6,751,134 B2 6/2004 Choi et al.
6,833,741 B2* 12/2004 Park ........................... 327/143
6,903,568 B2 6/2005 Ha et al.
6,996,023 B2* 2/2006 Kim ........................... 365/226
7,239,187 B2* 7/2007 Ishikawa .................... 327/143
7,586,350 B2* 9/2009 Chung et al. ................ 327/198

FOREIGN PATENT DOCUMENTS

| CN | 1577624 A | 2/2005 |
|---|---|---|
| CN | 1585033 | 2/2005 |
| JP | 11-149771 | 6/1999 |
| WO | WO 2004097608 A1 * | 11/2004 |
| WO | WO2004097608 A1 * | 11/2004 |

* cited by examiner

*Primary Examiner*—Lincoln Donovan
*Assistant Examiner*—Patrick O'Neill
(74) *Attorney, Agent, or Firm*—Blakely, Sokoloff, Taylor & Zafman

(57) ABSTRACT

Provided is a semiconductor memory device and a driving method for initializing an internal logic circuit within the semiconductor memory device under a stable state of a source voltage without an extra reset pin. The semiconductor memory device includes a power-up signal generating unit for generating a power-up signal; an internal reset signal generating unit for generating an internal reset signal in response to a pad signal inputted from an arbitrary external pin during a test mode; an internal logic initializing signal generating unit for generating an internal logic initializing signal based on the power-up signal and the internal reset signal; and an internal logic unit initialized in response to the internal logic initializing signal.

16 Claims, 3 Drawing Sheets

CIRCUIT AND METHOD FOR INITIALIZING AN INTERNAL LOGIC UNIT IN A SEMICONDUCTOR MEMORY DEVICE

CROSS-REFERENCE TO RELATED APPLICATION

This application is a continuation of application Ser. No. 11/479,689, filed on Jun. 30, 2006 now U.S. Pat. No. 7,586,350.

FIELD OF THE INVENTION

The present invention relates to a semiconductor memory device, and more particularly to a technology for initializing an internal logic circuit of a semiconductor memory device.

DESCRIPTION OF RELATED ARTS

Generally, a semiconductor memory device includes a plurality of internal logic circuits and an internal supply voltage generating block. The internal supply voltage generating block generates a plurality of internal supply voltages such as a core voltage VCORE, a peripheral voltage VPERI and a bit line precharge voltage VBLP from a source voltage source voltage VDD inputted from an external source, thereby guaranteeing a stable operation. Herein, the core voltage VCORE is used for reading data from a memory cell or writing data to the memory cell, and the peripheral voltage VPERI is used for operating the internal logic circuits included in the semiconductor memory device.

The internal logic circuits should be supplied with the internal supply voltages so as to be initialized before performing their own operation. The internal supply voltage generating block supplies the internal supply voltages with the internal logic circuits through a supply voltage terminal. At this time, if a voltage level of each internal supply voltage reaches a predetermined voltage level after the source voltage VDD is supplied, a latch-up problem occurs. As a result, it is difficult to guarantee reliability of the semiconductor memory device. To initialize the internal logic circuits without the latch-up problem, a power-up circuit is provided with the semiconductor memory device.

FIG. 1 is a block diagram of a conventional semiconductor memory device for initializing an internal logic circuit without a latch-up problem.

The conventional semiconductor memory device includes a power-up signal generating unit 100, an internal supply voltage generating unit 110 and an internal logic unit 120.

The power-up signal generating unit 100 generates a power-up signal PWRUP. The power-up signal PWRUP is activated with a shape of pulse when a source voltage VDD inputted from the external source reaches a predetermined voltage level. In general, the power-up signal generating unit 100 detects a voltage level of the source voltage VDD to generate the power-up signal PWRUP with a logic level 'LOW' when the source voltage VDD is lower than the predetermined voltage level and pulses the power-up signal PWRUP from a logic level 'HIGH' to the logic level 'LOW' when the source voltage VDD reaches the predetermined voltage level.

The internal supply voltage generating unit 110 is mostly composed of an analog circuit. The internal supply voltage generating unit 110 generates a plurality of internal supply voltages after the power-up signal PWRUP is transited from a logic level 'HIGH' to the logic level 'LOW' when the source voltage VDD reaches the predetermined voltage level, thereby stabilizing voltage levels of the internal supply voltages.

The internal logic unit 120 includes a sequential circuit such as a latch and a flip-flop, and a dynamic circuit such as a digital circuit. The internal logic unit 120 initializes internal signals of the sequential circuit and the dynamic circuit with predetermined values in response to the power-up signal PWRUP.

The power-up signal PWRUP is not transited after the source voltage VDD reaches the predetermined voltage level so that the internal supply voltages are stable. However, when the power-up signal PWRUP is transited after the source voltage VDD reaches the predetermined voltage level, it is difficult to determine whether the semiconductor memory device performs an initial operation in fault or not.

If the semiconductor memory device such as a double duty rate 3 synchronous dynamic random access memory (DDR3 SDRAM) may be initialized not by the power-up signal generating unit 100 but via a dedicated external reset pin, it is easy to determine whether the semiconductor memory device performs the initial operation in fault or not.

However, most semiconductor memory devices do not include an extra initializing apparatus such as a dedicated external reset pin. As a result, it is difficult to deal with errors which occur under a stable state of the source voltage VDD.

SUMMARY OF THE INVENTION

It is, therefore, an object of the present invention to provide a semiconductor memory device for initializing an internal logic circuit thereof under a stable state of a source voltage without an extra reset pin.

It is, therefore, another object of the present invention to provide a method for initializing an internal logic circuit of a semiconductor memory device under a stable state of a source voltage without an external reset pin.

In accordance with an aspect of the present invention, there is provided a semiconductor memory device, including: a power-up signal generating unit for generating a power-up signal; an internal reset signal generating unit for generating an internal reset signal in response to a pad signal inputted from an arbitrary external pin during a test mode; an internal logic initializing signal generating unit for generating an internal logic initializing signal based on the power-up signal and the internal reset signal; and an internal logic unit initialized in response to the internal logic initializing signal.

In accordance with another aspect of the present invention, there is provided a semiconductor memory device, including: a power-up signal generating unit for generating a power-up signal; a test mode determining unit for generating a test mode signal which is activated during the test mode; a logical combination unit for generating an internal reset signal by logically combining a pad signal inputted from an arbitrary external pin and the test mode signal; an internal logic initializing signal generating unit for generating an internal logic initializing signal based on the power-up signal and the internal reset signal; and an internal logic unit initialized in response to the internal logic initializing signal.

In accordance with further aspect of the present invention, there is provided a method for initializing a semiconductor memory device, including: generating a power-up signal activated when a voltage level of a source voltage inputted from external is higher than a predetermined voltage level; generating an internal reset signal in response to a pad signal inputted from an arbitrary external pin; generating an internal logic initializing signal based on the power-up signal and the internal reset signal; and initializing internal circuits of the semiconductor memory device with the internal logic initializing signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device for initializing an internal logic circuit thereof under a stable state of a source voltage without a dedicated external reset pin in accordance with the present invention will be described in detail referring to the accompanying drawings.

Figure 1:
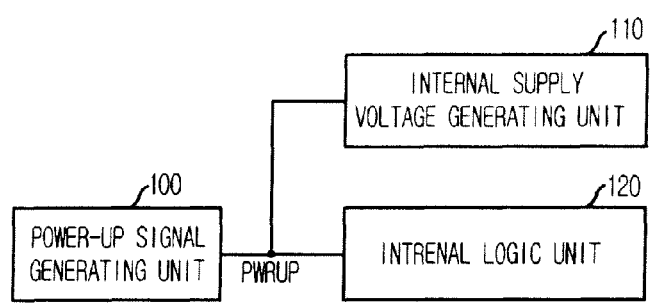
FIG. 1 is a block diagram of a conventional semiconductor memory device for initializing an internal logic circuit without a latch-up.
Figure 2:
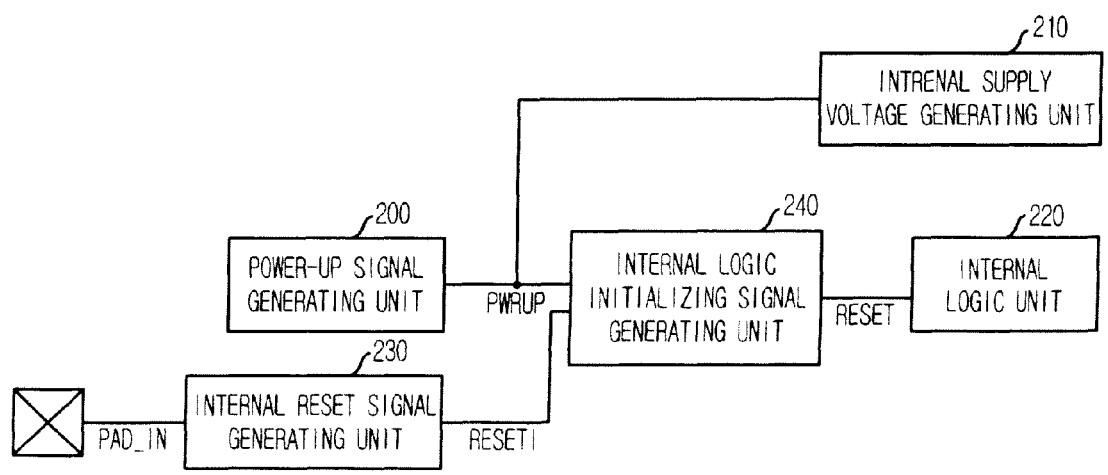
FIG. 2 is a block diagram of a semiconductor memory device for initializing an internal logic circuit without a latch-up in accordance with an embodiment of the present invention.

FIG. 2 is a block diagram of a semiconductor memory device for initializing an internal logic circuit without a latch-up in accordance with an embodiment of the present invention.

The semiconductor memory device includes a power-up signal generating unit 200, an internal supply voltage generating unit 210, an internal logic unit 220, an internal reset signal generating unit 230 and an internal logic initializing signal generating unit 240.

The power-up signal generating unit 200 generates a power-up signal PWRUP. The power-up signal PWRUP is activated when a voltage level of a source voltage VDD inputted from external is higher than a predetermined voltage level.

The internal supply voltage generating unit 210 generates a plurality of internal supply voltages from the source voltage VDD in response to the power-up signal PWRUP. The internal supply voltage generating unit 210 may include a core voltage (VCORE) generator, a peripheral voltage (VPERI) generator and a bit line precharge voltage (VBLP) generator.

The internal reset signal generating unit 230 generates an internal reset signal RESETI based on a pad signal PAD_IN inputted from an arbitrary external pin during a test mode. Herein, the arbitrary external pin is not a dedicated external reset pin but a general pin such as address pins and data pins which are allocated to generate internal signals.

The internal logic initializing signal generating unit 240 generates an internal logic initializing signal RESET in response to the power-up signal PWRUP and the internal reset signal RESETI.

The internal logic unit 220 is initialized with a preset value in response to the internal logic initializing signal RESET. The internal logic unit 220 includes a sequential circuit such as a latch and a flip-flop, and a dynamic circuit such as a digital circuit.

Figure 3:
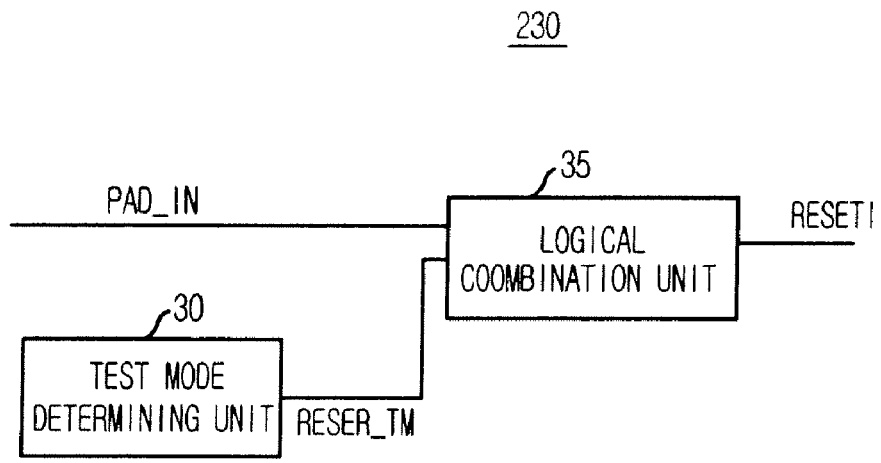
FIG. 3 is a detailed block diagram depicting an internal reset signal generating unit shown in FIG. 2.

FIG. 3 is a detailed block diagram depicting the internal reset signal generating unit 230 shown in FIG. 2.

The internal reset signal generating unit 230 includes a test mode determining unit 30 and a logical combination unit 35. The test mode determining unit 30 generates and activates a test mode signal RESET_TM during the test mode by using a reserved code of an external mode register set (EMRS). The test mode determining unit 30 activates The logical combination unit 35 generates the internal reset signal RESETI by logically combining the pad signal PAD_IN and the test mode signal RESET_TM.

Accordingly, the logical combination unit 35 activates the internal reset signal RESETI when the pad signal PAD_IN is activated during the test mode.

Figure 4:
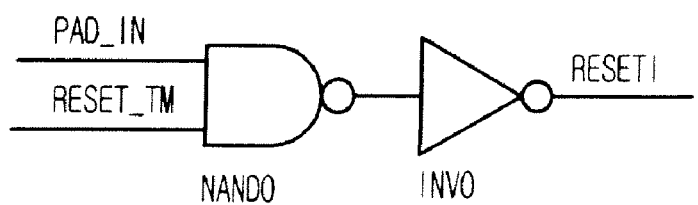
FIG. 4 is a detailed block diagram depicting a logic combination unit shown in FIG. 3.

FIG. 4 is a detailed block diagram depicting the logical combination unit 35 shown in FIG. 3.

The logical combination unit 35 includes a NAND gate NAND0 and an inverter INV0.

The NAND gate NAND0 performs a NAND operation of the pad signal PAD_IN and the test mode signal RESET_TM. The inverter INV0 inverts an output of the NAND gate NAND0 to output the internal reset signal RESETI.

Accordingly, the logical combination unit 35 outputs the pad signal PAD_IN as the internal reset signal RESETI during the test mode.

Figure 5A:
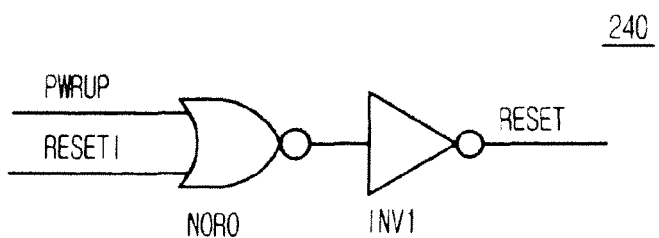
FIGS. 5A and 5B are detailed circuit diagrams showing an internal logic initializing signal generating unit, respectively, shown in FIG. 2.
Figure 5B:
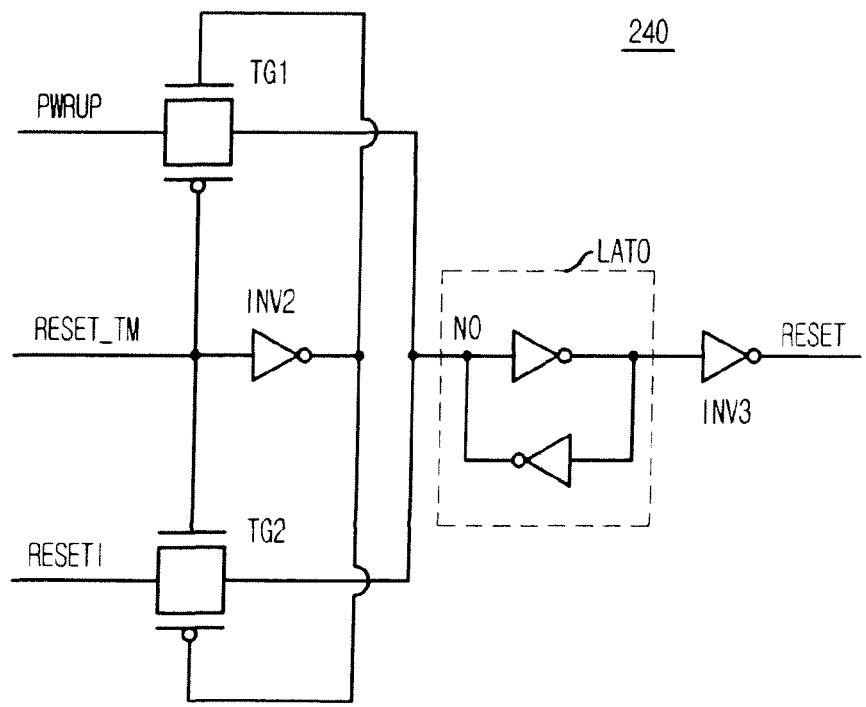

FIGS. 5A and 5B are detailed circuit diagrams showing the internal logic initializing signal generating unit 240, respectively, shown in FIG. 2. For reference, the internal logic initializing signal generating unit 240 uses the power-up signal PWRUP as the internal logic initializing signal RESET except for the test mode, and uses the internal reset signal RESETI as the internal logic initializing signal RESET during the test mode. The internal logic initializing signal generating unit 240 may be implemented with various embodiments.

Referring to FIG. 5A, the internal logic initializing signal generating unit 240 includes a NOR gate NOR0 and an inverter INV1.

The NOR gate NOR0 performs a NOR operation of the power-up signal PWRUP and the internal reset signal RESETI. The inverter INV1 inverts an output of the NOR gate NOR0 to output the internal logic initializing signal RESET.

Accordingly, the internal logic initializing signal generating unit 240 shown in FIG. 5A activates and outputs the internal logic initializing signal RESET when any one of the power-up signal PWRUP and the internal reset signal RESETI is activated.

Referring to FIG. 5B, the internal logic initializing signal generating unit 240 includes first and second transfer gates TG1 and TG2, first and second inverters INV2 and INV3, and an inverter latch unit LAT0.

The first transfer gate TG1 selectively transfers the power-up signal PWRUP in response to an inverted test mode signal inverted by the first inverter INV2. The second transfer gate TG2 selectively transfers the internal reset signal RESETI in response to the test mode signal RESET_TM. The inverter latch unit LAT0 latches a signal at a common node N0 of the first and second transfer gates TG1 and TG2. The second inverter INV3 inverts an output of the inverter latch unit LAT0 to output the internal logic initializing signal RESET.

Accordingly, the internal logic initializing signal generating unit 240 shown in FIG. 5B outputs the power-up signal PWRUP as the internal logic initializing signal RESET except for the test mode, and outputs the internal reset signal RESETI as the internal logic initializing signal RESET for the test mode.

Hereinafter, referring to FIGS. 2 to 5B, an operation of the semiconductor memory device for initializing the internal logic circuit will be described.

First, if the voltage level of the source voltage VDD from the external reaches the predetermined voltage level, the power-up signal PWRUP pulses with the logic level 'HIGH' for a short time. The internal logic initializing signal generating unit 240 outputs the power-up signal PWRUP as the internal logic initializing signal RESET. Accordingly, the sequential circuit such as the latch and the flip-flop, and the dynamic circuit such as the digital circuit within the internal logic unit 220 are initialized with a preset value in response to the internal logic initializing signal RESET.

Meanwhile, all of the core voltage (VCORE) generator, the peripheral voltage (VPERI) generator and the bit line precharge voltage (VBLP) generator within the internal supply voltage generating unit 210 generate their own voltage after the power-up signal PWRUP pluses with the logic level 'HIGH' for a short time. For reference, the internal supply voltage generating unit 210 may be operated based on the power-up signal PWRUP as an enable signal. Herein, the power-up signal PWRUP as the enable signal is changed into a level-shape from a pulse-shape.

Henceforth, after the voltage level of the source voltage VDD is stabilized so that the semiconductor memory device operates normally, the test mode signal RESET_TM is activated with the logic level 'HIGH', the logical combination unit 35 activates or inactivates the internal reset signal RESETI according to a state of the pad signal PAD_IN applied via the arbitrary external pin.

In detail, referring to FIG. 4, when the test mode signal RESET_TM and the pad signal PAD_IN are a logic level 'HIGH', the internal reset signal RESETI is activated with a logic level 'HIGH'. When the test mode signal RESET_TM is a logic level 'HIGH' and the pad signal PAD_IN is a logic level 'LOW', the internal reset signal RESETI is inactivated with a logic level 'LOW'. Herein, it is recommended that the pad signal PAD_IN is applied with the pulse-shape such as the power-up signal PWRUP.

If the internal reset signal RESETI pulses with a logic level 'HIGH' for a short time, the internal logic initializing signal generating unit 240 outputs the internal reset signal RESETI as the internal logic initializing signal RESET. The sequential circuit such as the latch and the flip-flop, and the dynamic circuit such as the digital circuit within the internal logic unit 220 are initialized with the preset value in response to the internal logic initializing signal RESET.

Meanwhile, the internal supply voltage generating unit 210 is not affected by the internal reset signal RESETI so that all of the core voltage (VCORE) generator, the peripheral voltage (VPERI) generator and the bit line precharge voltage (VBLP) generator within the internal supply voltage generating unit 210 generate their own voltage regardless of an initial operation of the internal logic unit 220.

When an error is detected by a specific test, the internal logic unit 220 of the semiconductor memory device enters the test mode and is initialized by using the allocated external pad. If the error is not detected by the specific test after being initialized, it is assumed that the error is a fault occurred by the initial operation of the internal logic unit 220.

In accordance with the embodiment of the present invention, all of signals, i.e., the power-up signal PWRUP, the internal reset signal RESETI, the test mode signal RESET_TM and the internal logic initializing signal RESET, are activated with the logic level 'HIGH'. In other embodiments, any one of the signals may be activated with the logic level 'LOW' and thus logic gates thereof is should be changed accordingly.

As described above, the semiconductor memory device of the present invention adopts the internal reset signal generating unit as well as the power-up signal generating unit. Therefore, the internal logic unit within the semiconductor memory device is initialized not only when the source voltage from the external is supplied but also during operating without the dedicated external reset pin. The internal reset signal generating unit may be implemented by using the arbitrary external pin and information indicating the test mode. In this case, it is possible to easily control the internal logic unit in response to a state of the arbitrary external pin. In addition, it is possible to determine whether an error occurred during operating is caused by a wrong initial operation or not. As a result, the error may be easily solved.

In the meanwhile, if the internal supply voltage generating unit is initialized during operating, the internal supply voltage generating unit may perform a normal operation after the complicated initial operation. As a result, it is desirable to separately control the internal logic unit from the internal supply voltage generating unit.

The present application contains subject matter related to Korean patent application Nos. 2005-90840 & 2005-134009, filed in the Korean Patent Office on Sep. 28, 2005 & Dec. 29, 2005, respectively, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
an internal reset signal generating unit for generating an internal reset signal based on a pad signal inputted from an arbitrary external pin during a test mode
an internal logic initializing signal generating unit for generating an internal logic initializing signal based on the internal reset signal; and
an internal logic unit initialized in response to the internal logic initializing signal,
wherein a voltage level of a source voltage inputted from an external source is higher than a predetermined voltage level when a power-up signal is enabled,
wherein the internal reset signal generating unit generates a test mode signal which is activated during the test mode and includes a logic gate for performing, a NAND operation on the pad signal and the test mode signal, and an inverter for inverting an output of the logic gate to output the internal reset signal.

2. The semiconductor memory device as recited in claim 1, wherein the arbitrary external pin is not a reset dedicated pin.

3. The semiconductor memory device as recited in claim 1, further comprising an internal supply voltage generating unit for generating a plurality of internal supply voltages from a source voltage in response to the power-up signal.

4. The semiconductor memory device as recited in claim 1, wherein said internal logic initializing signal generating unit outputs the internal logic initializing signal activated when any one of the power-up signal and the internal reset signal is activated.

5. The semiconductor memory device as recited in claim 4, wherein the internal logic initializing signal generating unit includes:

a logic gate for performing a NOR operation of the power-up signal and the internal reset signal; and an inverter for inverting an output of the logic gate to output the internal logic initializing signal.

6. A semiconductor memory device, comprising:

a power-up signal generating unit for generating a power-up signal;

a test mode determining unit for generating a test mode signal which is activated during a test mode;

a logical combination unit for generating an internal reset signal by logically combining a pad signal inputted from an arbitrary external pin and the test mode signal;

an internal logic initializing signal generating unit for generating an internal logic initializing signal based on the power-up signal and the internal reset signal; and an internal logic unit initialized in response to the internal logic initializing signal, wherein the logical combination unit includes:

a logic gate for performing a NAND operation the pad signal and the test mode signal; and an inverter for inverting an output of the logic gate to output the internal reset signal.

7. The semiconductor memory device as recited in claim 6, wherein the arbitrary external pin is not a reset dedicated pin.

8. The semiconductor memory device as recited in claim 6, wherein the power-up signal is activated when a voltage level of a source voltage inputted from an external source is higher than a predetermined voltage level.

9. The semiconductor memory device as recited in claim 6, further comprising an internal supply voltage generating unit for generating a plurality of internal supply voltages from a source voltage in response to the power-up signal.

10. The semiconductor memory device as recited in claim 6, wherein the logical combination unit outputs the pad signal as the internal reset signal during the test mode.

11. The semiconductor memory device as recited in claim 6, wherein the internal logic initializing signal generating unit outputs the internal logic initializing signal activated when any one of the power-up signal and the internal reset signal is activated.

12. The semiconductor memory device as recited in claim 11, wherein the internal logic initializing signal generating unit includes:

a logic gate for performing a NOR operation of the power-up signal and the internal reset signal; and an inverter for inverting an output of the logic gate to output the internal logic initializing signal.

13. The semiconductor memory device as recited in claim 11, wherein the internal logic initializing signal generating unit includes:

a first transfer gate for transferring the power-up signal in response to an inverted test mode signal;

a second transfer gate for transferring the internal reset signal in response to the test mode signal;

a latch unit for latching a signal at a common output node of the first and second transfer gates; and an inverter for inverting an output of the latch unit to output the internal logic initializing signal.

14. A method for initializing a semiconductor memory device, comprising:

generating an internal reset signal in response to a pad signal inputted from an arbitrary external pin during a test mode;

generating an internal logic initializing signal based on the internal reset signal; and initializing internal circuits of the semiconductor memory device with the internal logic initializing signal, wherein a voltage level of a source voltage inputted from an external source is higher than a predetermined voltage level wherein generating the internal reset signal includes:

generating a test mode signal activated during the test mode;

performing a NAND operation of the pad signal and the test mode signal; and inverting an output of the NAND operation to output the internal reset signal for generating the internal reset signal.

15. The method as recited in claim 14, wherein the pad signal is outputted as the internal reset signal when the test mode signal is activated.

16. The method as recited in claim 14, wherein the internal logic initializing signal is activated when any one of a power-up signal and the internal reset signal is activated.

* * * * *